United States Patent
Jiang et al.

(10) Patent No.: US 6,737,702 B1
(45) Date of Patent: May 18, 2004

(54) ZERO POWER MEMORY CELL WITH REDUCED THRESHOLD VOLTAGE

(75) Inventors: Chun Jiang, San Jose, CA (US); Sunil Mehta, San Jose, CA (US); Stewart Logie, Campbell, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/626,089

(22) Filed: Jul. 24, 2003

Related U.S. Application Data

(62) Division of application No. 10/128,943, filed on Apr. 24, 2002, now Pat. No. 6,660,579.

(51) Int. Cl.[7] .............................................. H01L 29/788
(52) U.S. Cl. ....................... 257/315; 257/336; 257/344; 257/345; 257/404
(58) Field of Search ............................... 257/336, 344, 257/345, 404

(56) References Cited

U.S. PATENT DOCUMENTS

| | | | |
|---|---|---|---|
| 4,924,278 A | 5/1990 | Logie | |
| 5,587,945 A | 12/1996 | Lin et al. | |
| 5,596,524 A | 1/1997 | Lin et al. | |
| 5,719,422 A | * 2/1998 | Burr et al. | ................... 257/336 |
| 5,761,116 A | 6/1998 | Li et al. | |
| 6,001,691 A | 12/1999 | Wen | |
| 6,143,594 A | 11/2000 | Tsao et al. | |
| 6,208,559 B1 | 3/2001 | Tu et al. | |
| 6,258,645 B1 | 7/2001 | Kang | |
| 6,406,955 B1 | 6/2002 | Kim et al. | |
| 6,468,849 B1 | 10/2002 | Efland et al. | |

* cited by examiner

*Primary Examiner*—Huan Hoang
*Assistant Examiner*—Mai-Huong Tran

(57) ABSTRACT

A zero power memory cell includes first and second NMOS transistors and a PMOS transistor, wherein the first NMOS transistor and first PMOS transistor each include a three-implant channel region, and wherein the second NMOS transistor further includes a two-implant channel region.

9 Claims, 5 Drawing Sheets

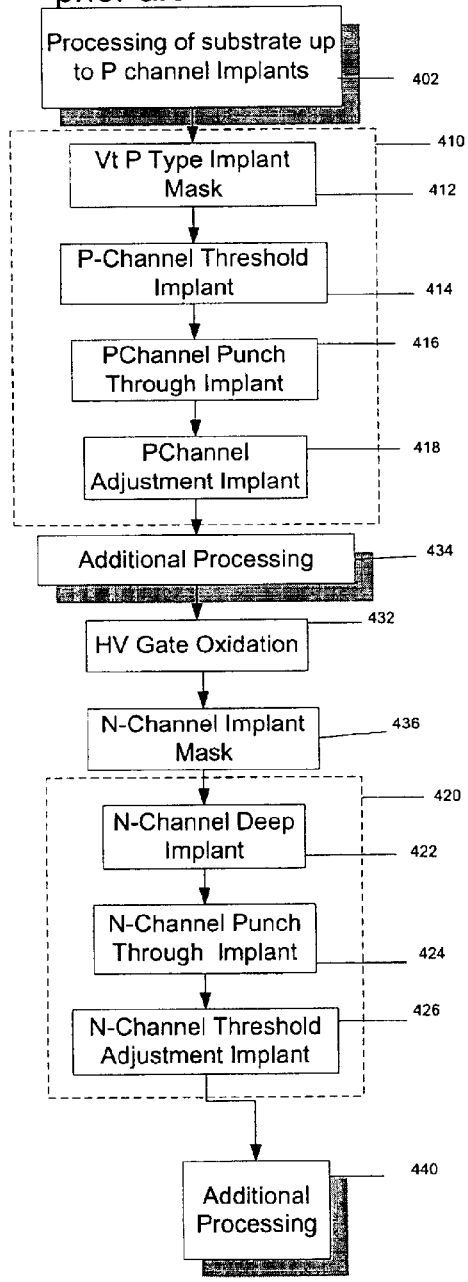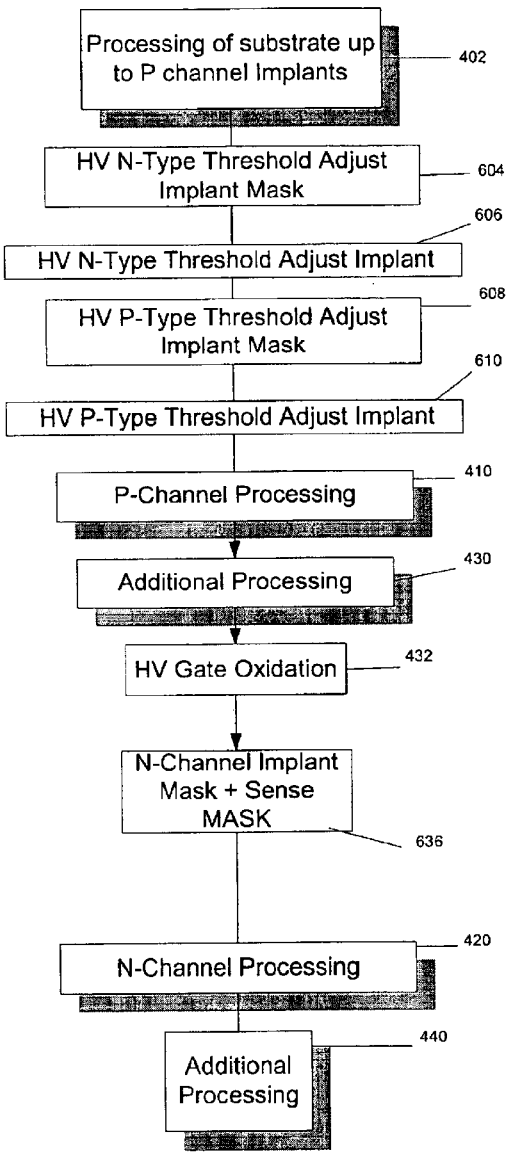

Figure 7A
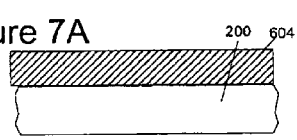 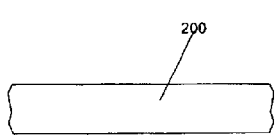 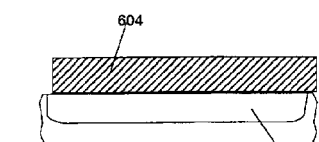
Figure 7B
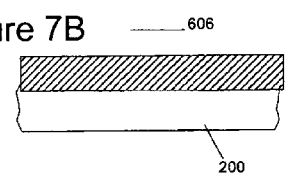 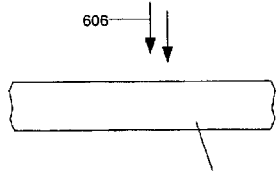 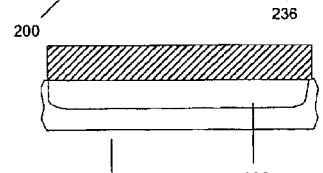
Figure 7C
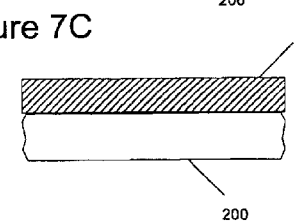 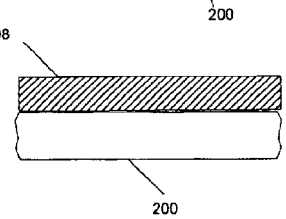 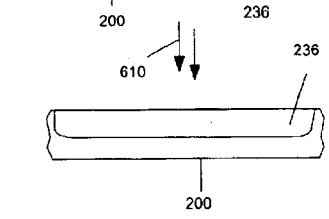
Figure 7D
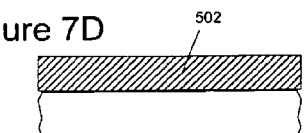 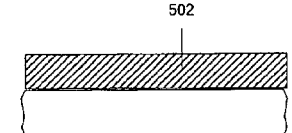 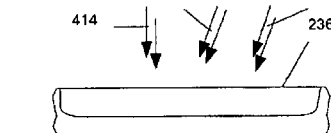
Figure 7E
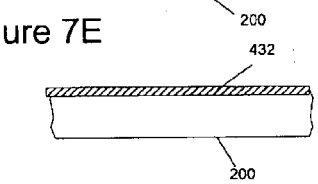 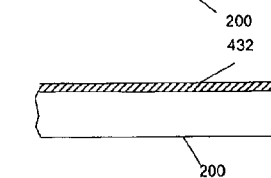 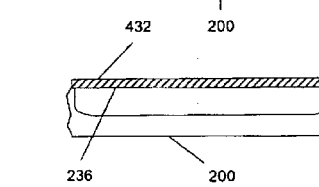
Figure 7F
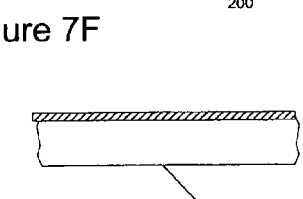 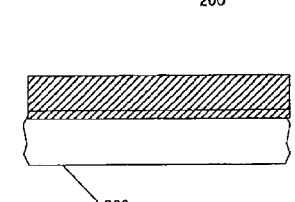 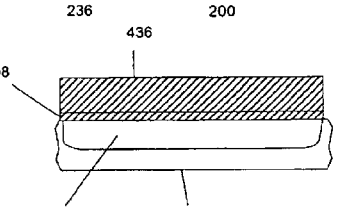
Figure 7G
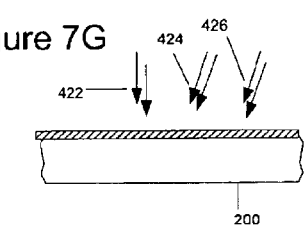 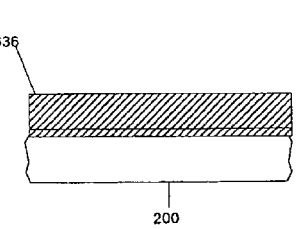 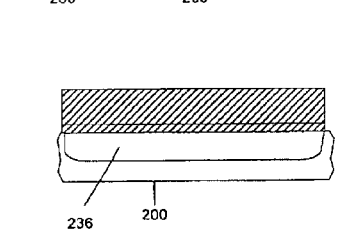

ZERO POWER MEMORY CELL WITH REDUCED THRESHOLD VOLTAGE

RELATED APPLICATION DATA

This application is a divisional of application Ser. No. 10/128,943, filed Apr. 24, 2002, now U.S. Pat. No. 6,660,579.

TECHNICAL FIELD

The present invention is directed to improvements in memory cells using no power, and in particular, to improvements in data retention in such cells by lowering the threshold voltage of one or more transistors used in the cell.

BACKGROUND

Nonvolatile memory cells are used in a variety of applications. As with many semiconductor device technologies, non-volatile memory device designers strive to increase the performance of devices, while decreasing device dimensions and consequently increasing circuit density. Designers also strive to reduce power requirements of devices by reducing program and erase voltage requirements.

Generally, arrays of individual memory cells are formed on a single substrate and combined with sense and read circuitry, and connected by row-wise and column-wise conductive regions or metallic conductors to allow for array wide bulk program and erase as well as selected bit programming.

Ideally, cells are designed to be reliable in retaining the state of their programming (either having charged or discharged floating gates) with no power attached to the cell.

Over time, the EEPROM memory cell will be written and erased repeatedly as data is stored and removed from the memory cell. Since the EEPROM memory cell relies on charge exchange between the substrate and the floating-gate electrode, considerable stress is placed on the tunnel oxide underlying the floating-gate electrode. The charge-induced stress in the tunnel oxide can cause charge-trapping sites to form within the tunnel oxide. The formation of these charge-trapping sites is undesirable because, once formed, electrical current can leak through the tunnel oxide layer from the floating-gate electrode to the substrate. When charge leaks off the floating-gate electrode a data error occurs in the EEPROM memory cell.

One solution to the tunnel oxide leakage problem is to form thicker oxide layers within the EEPROM device. By providing more oxide, the formation of a small number of charged trapping sites can be tolerated without deleterious current leakage in the device. While fabricating the oxide layers to greater thicknesses reduce charge leakage problems, the thicker oxide layers have the undesirable side effect of increasing the overall size of the EEPROM memory cell.

A need therefore exists for a way to improve data retention in memory cells without increasing their size.

SUMMARY

The present invention, roughly described, pertains to a method for forming a three transistor zero power memory cell including a p-channel sense transistor, an n-channel write transistor, and an n-channel sense transistor. In one aspect, the method includes: implanting a p-type impurity into a p-type substrate in which a n-channel high voltage transistor will be formed; implanting an n-type impurity into an n-type well in a p-type substrate in which a p-channel high voltage transistor will be formed; forming a mask to allow implants to occur to p-channel devices; performing a series of n-type dopant implants into the substrate where the p-channel transistors will be formed; growing a high voltage gate oxide; forming a mask to allow implants to occur to n-channel devices, said mask blocking implants to said n-channel sense transistor; and performing a series of p-type implants into the substrate where the n-channel devices will be formed.

In a further aspect, the invention comprises a memory cell. The memory cell may include a first NMOS transistor having a source, drain and gate, and a first PMOS transistor. The first PMOS transistor has a source, drain and gate, and the gate of the PMOS transistor is coupled to a floating gate region and said gate of said first NMOS transistor. In addition, the drain of said PMOS transistor is coupled to the drain of said first NMOS transistor. The memory cell further includes a second NMOS transistor, having a source coupled to a tunnel capacitor, the output of the tunnel capacitor coupled to the floating gate region. In a further aspect, the first NMOS transistor and first PMOS transistor each include a three-implant channel region, and wherein the second NMOS transistor further includes a two-implant channel region.

These and other aspects of the present invention will appear more clearly from the following description in which the preferred embodiment of the invention has been set forth in conjunction with the drawings.

BRIEF DESCRIPTION OF THE DRAWINGS

The invention will be described with respect to the particular embodiments thereof. Other aspects of the invention will become apparent with reference to the specification and drawings in which:

FIG. 4 is a flowchart depicting a portion of the manufacturing process of a prior art three-transistor memory cell.

FIG. 6 is a flowchart depicting a portion of the manufacturing process of a three-transistor memory cell formed in accordance with the present invention.

FIGS. 7A–7G are cross-sections of the process of the present invention shown in FIG. 6 shown relative to the three transistors depicted in FIG. 2 and in cross-section in FIGS. 3A–3C, respectively.

DETAILED DESCRIPTION

In the present invention, an improved zero power memory cell, a method for improving the cell, and a technique which may be used to improve the zero-power memory characteristics of other memory cells are disclosed. In one embodiment, the voltage crossing a sense NMSOFET oxide during the cell's programmed state is lowered, without affecting any of the cell's zero power characteristics. As a result, data retention characteristics are improved.

Figure 1:
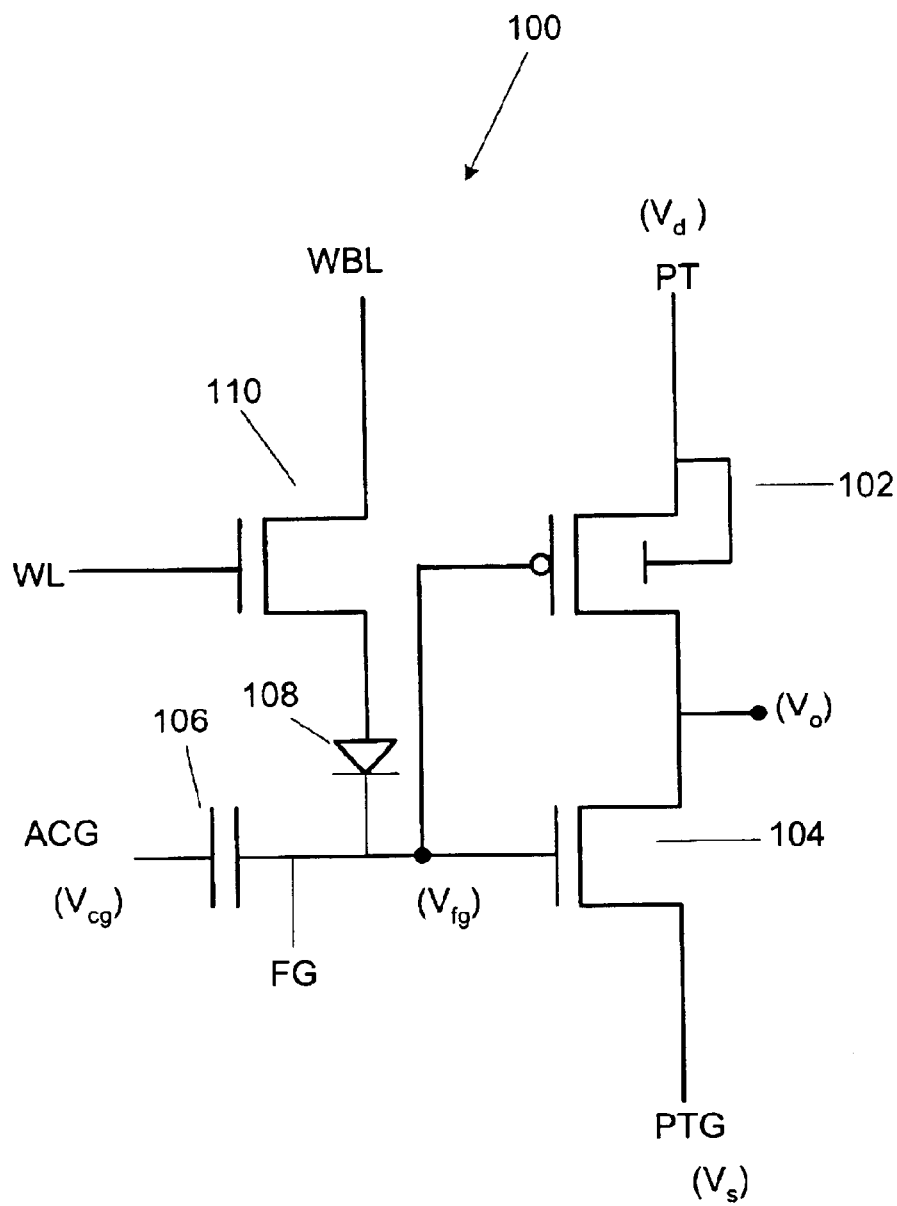
FIG. 1 is a schematic diagram of a three-transistor memory cell.

FIG. 1 illustrates the configuration of a conventional CMOS memory cell 100 having a PMOS sense transistor 102 and a sense NMOS transistor 104 with a common floating gate FG. Drains of transistors 102 and 104 are connected together to form the output of the CMOS cell 100. Capacitor 106 is connected to couple voltage to the common floating gate. Bias voltage is provided to the source of PMOS transistor 102 from a chip product term (PT) pin. This voltage is otherwise referred to herein as the $V_d$ of the cell 100. Bias voltage is provided to the source of the NMOS transistor 104 through a product term ground (PTG) pin, also referred to herein as the $V_s$ of the cell. Capacitor 106 supplies voltage from an array control gate (ACG) node. An NMOS sense transistor 110 supplies a word bit line control (WBL) voltage to tunnel capacitor 108, as controlled by a word line (WL) voltage supplied to its gate.

Typical voltages applied for program, erase and read of the CMOS memory cell 100 are listed in Table 1 and the table of FIG. 8 below. In this application, programming indicates electrons are removed from the common floating gate, while erase indicates that electrons are added to the common floating gate. Table 1, below, shows how the voltages in FIG. 8 are generally applied to accomplish program, erase and read.

TABLE 1

|  | WBL | WL | ACG | Vd | Vs |
|---|---|---|---|---|---|
| Program | Vpp | Vpp+ | 0 | 0 | 0 |
| Erase | 0 | Vcc | Vpp+ | Vcc | Vcc |
| Read | Vcc/2 | Vcc | Vcc/2 | Vcc | 0 |

The CMOS memory cell 100 is advantageous because it enables zero power operation. Zero power operation refers to the fact that a component does not continually draw power when the component is not changing states. For instance, with an appropriate voltage applied to the common floating gate FG, PMOS transistor 102 will conduct and NMOS transistor 104 will not conduct. Current will then be provided from $V_d$ ($V_c$) through PMOS transistor 102 to the output until the output is charged up to $V_c$. In this configuration, no current will be provided through NMOS transistor 104 to $V_s$. Further, with another voltage applied to the common floating gate 206, NMOS transistor 104 will conduct while PMOS transistor 102 does not. The output will then discharge to $V_s$. No additional current will be provided through PMOS transistor 102 from $V_c$ to $V_s$.

Figure 2:
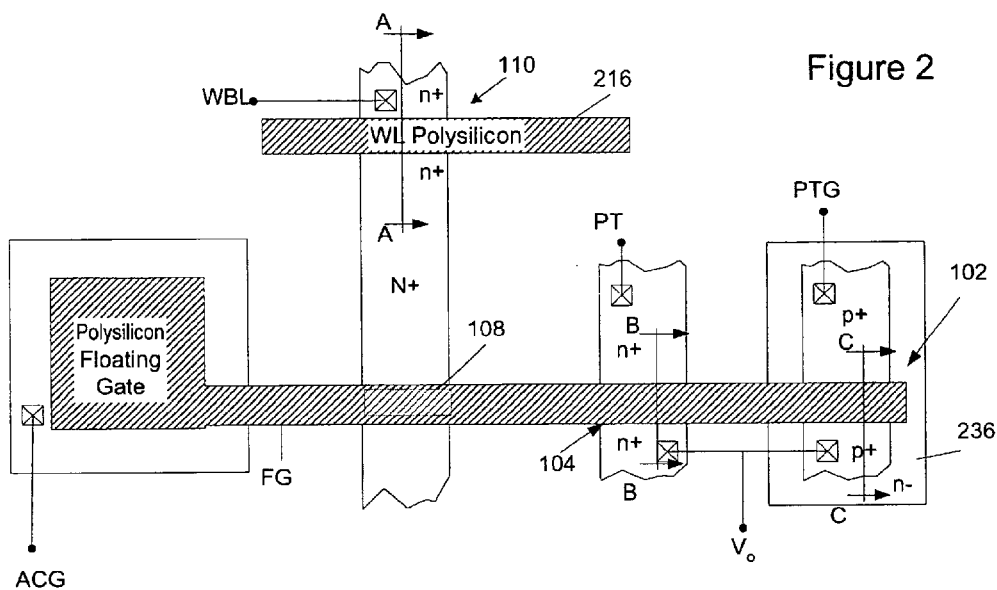
FIG. 2 is a plan view of an exemplary three-transistor memory cell formed in accordance with the present invention.
Figure 3A:
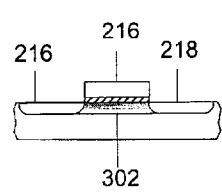
FIGS. 3A–3C are exemplary cross-sections of the transistors shown in FIG. 2 along lines AA', BB', and CC'.
Figure 3B:
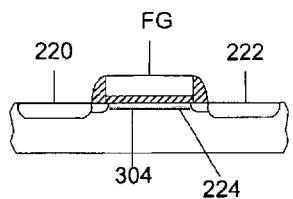
Figure 3C:
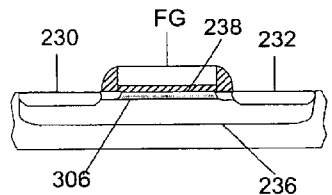

FIG. 2 shows a plan view of a layout for the cell 100 of FIG. 1. While one such layout is presented, it should be understood that the invention is not limited to the layout shown in FIG. 2 and numerous alternative layouts may be utilized without departing from the scope and content of the present invention. FIGS. 3A–3C show respective cross sectional views at AA', BB', CC', in FIG. 2. The layout for the CMOS cell shown in FIGS. 3A–3C is formed in a p type substrate having a typical background doping concentration of a P-type impurity of $10^{15}$–$10^{17}$ cm$^{-3}$, and is hence referred to herein as a P-substrate. Source and drain regions for the transistors, described below, are formed by, for example, any number of well known implantation and diffusion steps. In additional alternative embodiments, the substrate may comprise alternatives to bulk silicon materials well known in the semiconductor industry including, but not limited to, germanium, germanium silicon, gallium arsenide, polysilicon, silicon-on-insulator, or the like.

In the present invention, adjustments are made to the operating threshold voltages of the transistors 102, 104 and 110. Hence, details of the cell other than those pertaining to the construction of these transistors have been omitted for clarity. One of average skill in the art would readily understand the construction of various portions of cell 100 as such construction is widely known in the state of the art as exhibited by U.S. Pat. Nos. 5,587,945 and 5,596,524, which are hereby incorporated by reference.

As shown in FIG. 3A, NMOS write transistor 110 is formed by a polysilicon (POLY) word line (WL) region 216 on the substrate with a portion of region 216 overlying n+ implant region 210 and another portion overlying an additional n+ implant region 218. A substrate threshold adjustment implant region 302 is shown, formed by pre-doping the substrate with a plurality of doping steps via techniques illustrated with respect to FIGS. 4 and 5A–5D, or in accordance with the method of the present invention disclosed with respect to FIGS. 6 and 7A–7G.

As shown in FIG. 3B, NMOS sense transistor 104 includes two n+implant regions 220 and 222 in the p substrate. A gate oxide region 224 of approximately 90 Å. is placed on the substrate bridging regions 222 and 220. The common floating gate 206 overlies the gate oxide region 224. In one embodiment, spacers may be provided as well as lightly doped drain extension regions 222a, 220a adjacent to the n+ implant regions. Substrate channel adjustment region 304 underlies the gate oxide and is formed by pre-doping the substrate with a plurality of doping steps via techniques illustrated with respect to FIGS. 4 and 5A–5D, or in accordance with the method of the present invention disclosed with respect to FIGS. 6 and 7A–7G.

As shown in FIG. 3C, PMOS sense transistor 102 includes two p type regions 230 and 232 included in a n-type well 236 which is included in the p type substrate. A gate oxide region 238 of approximately 90 Å is placed on the substrate bridging the regions 230 and 232. The common floating gate FG overlies the gate oxide region 238. Substrate channel adjustment region 306 underlies the gate oxide and is formed by pre-doping the substrate with a plurality of doping steps via techniques illustrated with respect to FIGS. 4 and 5A–5D, or in accordance with the method of the present invention disclosed with respect to FIGS. 6 and 7A–7G. Spacers and LDD regions may also be provided.

FIGS. 4 and 5A–5D illustrate a method of forming the transistors 102, 104 and 110 in accordance with the prior art, with transistor 110 at the left, transistor 104 in the middle, and transistor 102 at the right of FIGS. 5A–D. As will be generally understood by one of average skill in the art, only those processing steps affecting the channel implants to the substrate are illustrated, and numerous other processing steps are required in order to fabricate a complete device. Such additional processing steps are well within the knowledge of one of average skill in the art and are thus omitted here in order to not unduly cloud the features of the present invention.

It will be further generally understood that FIGS. 5A–5D show multiple steps represented in FIG. 4, and hence each of FIGS. 5A–5D are not single representations of an instantaneous temporal moment, but rather illustrate differences between the method of the present invention shown in FIGS. 6 and 7 and the prior art.

In the prior art method shown in FIG. 4, processing up to the point in the process wherein the p-channel adjustment implants normally used in the prior art is illustrated at process box 402. Such processing may include pre-doping, cleaning, annealing and other manufacturing steps utilized to form isolation regions and defined source and drain active regions. In one prior art process, processing box 402 includes an initial N-type threshold voltage adjustment implant which may be made to the NMOS write transistor 110 before additional threshold voltage adjustment implants, described below, are performed. This implant is performed by forming a mask layer to expose the substrate at a region where the NMOS write transistor 110 is to be formed, and implanting Arsenic at an energy of about 55 KeV to form an impurity region having a concentration of about $3.05 \times 10^{12}$ atm/cm².

Figure 5A:
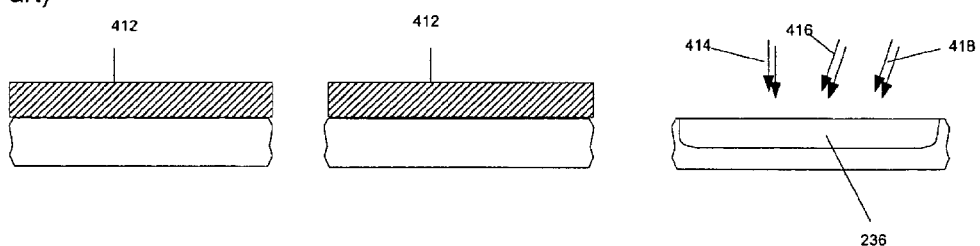
FIGS. 5A–5D are cross-sections of the process in FIG. 4 shown relative to the three transistors depicted in FIG. 2 and in cross-section in FIGS. 3A–3C, respectively.

Next, a group of steps 410 affecting the p-channel device threshold characteristics is performed. With reference to FIG. 5A and FIG. 4, at step 412, a p-channel device implant mask is formed over the surface of the substrate. Mask layer 412 is deposited over the surface of the substrate then photolithographically patterned and etched in accordance with well known techniques in order to expose only the so-called p-channel devices (devices whose operation is the result of the formation of a p-type channel in an n-type well or substrate), preventing implants into all but those devices formed in the n-well regions 236 as shown in FIG. 5A.

Following completion of the mask layer, a first threshold adjustment implant 414 is performed. Such implant is performed by well-known techniques using a phosphorous (P) impurity at an energy of 250 KeV to provide a region having a concentration of $4 \times 10^{12}$ atm/cm².

Next, a p-channel punch through implant is performed at step 416. As will be understood by those of average skill, the punch through implant prevents the punch through effect where the depletion layers around the drain and source regions merge into a single depletion region. In this implant, for example, an Arsenic (As) implant at an energy of about 200 KeV and an implant angle of about 7° is used to provide a concentration of about $4.0 \times 10^{12}$ atm/cm².

A final p-channel implant is a relatively shallow implant to further adjust the threshold voltage. At step 418 in FIG. 4, a channel adjustment implant is performed using phosphorous at an energy of about 60 KeV and an angle of about 7° to form an implant region having a concentration of $3.2 \times 10^{12}$ atm/cm².

Figure 5B:
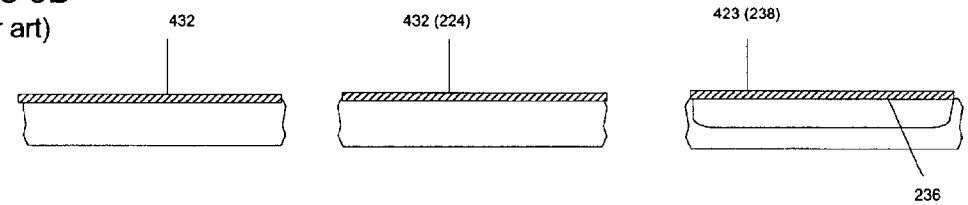

Next, as shown in FIG. 4 at process box 434, additional processing (such as, for example, the well known techniques for a "RCA" (Radio Corporation of America) chemical clean before oxidation of the HV transistors) will occur on the substrate up to the point of gate oxidation. As shown in FIGS. 4 and 5B, a gate oxide layer having a thickness of about 90 Å is then grown on the surface of substrate 200. Oxide layer 432 is generally formed by immersing the substrate in an oxygen-containing atmosphere and heating the substrate for a period of time sufficient to grow the oxide to the desired thickness.

Figure 5C:
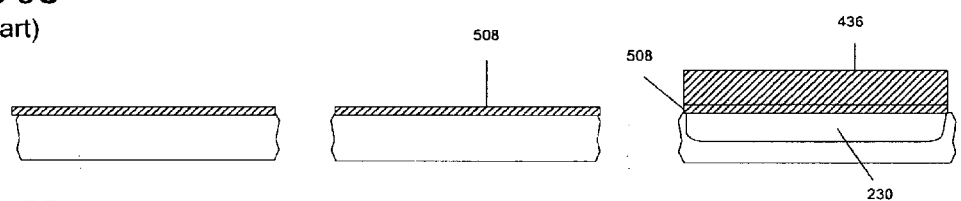
Figure 5D:
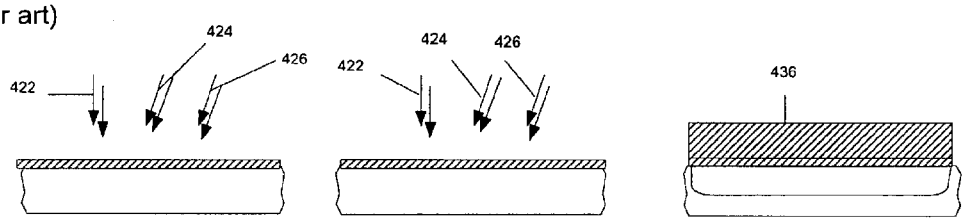

Next, as shown in FIGS. 4 and 5C, an n-channel device implant mask 436 is formed on the surface of the substrate 200. With reference to FIG. 5C and FIG. 4, at step 434, a n-channel device implant mask is formed over the surface of the substrate. Mask layer 436 is deposited over the surface of the substrate then photolithographically patterned and etched in accordance with well known techniques in order to expose only the n-channel devices, preventing implants into devices formed in the p-substrate as shown in FIG. 5B.

Next, a group of steps 420 affecting the n-channel device threshold characteristics by forming n-channel implants 302, 304 is performed. Following completion of the mask layer, a first threshold adjustment implant 422 is performed. Such implant is performed by well-known techniques using a boron (B+) impurity at an energy of 115 KeV to provide an implant having a concentration of $4.4 \times 10^{12}$ atm/cm².

Next, a n-channel punch through implant is performed at step 424. In this implant, for example, an boron (B+) implant at an energy of about 50 KeV and an implant angle of about 7° to provide a concentration of about $4.0 \times 10^{12}$ atm/cm² is used.

A final n-channel implant is a relatively shallow implant to further adjust the threshold voltage. At step 426 in FIG. 4, a channel adjustment implant is performed using $BF_2$ at an energy of about 40 KeV and an angle of about 7° to form an implant region having a concentration of $3.2 \times 10^{12}$ atm/cm².

In accordance with the invention, to improve characteristics of cell data retention at zero power, the threshold voltage of NMOSFET 104 is lowered during the cell's programmed state. In general, the voltage at the gate of the sense MOSFET 104 is approximately equal to $\alpha V_{cg} + V_{fgp}$, where $V_{fgp}$ is the floating gate potential of the programmed cell. $V_{cg}$ is a reference voltage set automatically by off-chip circuitry. The value of $V_{cg}$ is related to $V_{pp}$ and the threshold voltage $V_T$ of the NMOSFET 104 and the PMOSFET 102. $V_{cg}$ is set to guarantee an appropriate on and off state during both the programmed and erased states. $\alpha$ is a coupling coefficient determined by the ratio of the ACG capacitor and sense transistor capacitor. Here $\alpha$ is equal to ~85%. In the exemplary cell of the present invention following sense transistor $V_t$ adjustment, $V_{cg}$ is approximately 1.0 volt and $V_{fgp}$ is 1.3 volts.

In order to lower the programmed state voltage, in one embodiment, both NMOS threshold $V_{tn}$ and PMOS threshold $V_{tp}$ are reduced by some amount, referred to herein as delta $V_t$, so that the characteristics of transistors 102 and 104 such as the source/drain current ($I_{ds}$) and the leakage currents ($I_{off}$) will not be affected. Consequently, $V_{cg}$ can be lowered by delta Vt.

A method for constructing the cell of FIG. 1 with a lowered sense transistor voltage during programming is shown with respect to FIGS. 6 and 7A–7G, with transistor 110 at the left, transistor 104 in the middle, and transistor 102 at the right of FIGS. 7A–G.

As shown in FIG. 6, the process of the present invention begins subsequent to the processing of the substrate up to the point in the process when the p-channel device threshold adjustment implants would normally occur as shown by step 402 in FIG. 6. As with the process illustrated in FIG. 4, the NMOS processing 402 may include an N-type threshold adjustment implant step for the NMOS write transistor 110 prior to the additional threshold implants set forth below.

Next, a N-channel adjustment mask and implant will be provided as illustrated at steps 604 and 606 in FIG. 6 and FIG. 7A. As shown in FIG. 7A, the n-channel implant mask 604 will prevent implantation into the PMOSFET sense transistor and NMOS write transistor. Mask layer 604 is deposited over the surface of the substrate is photolithographically patterned and etched in accordance with well known techniques in order to expose only the substrate area where the NMOS sense transistor is formed. Next, at step 606, and as illustrated in FIG. 7B, an implant of boron at an energy of 25 KeV and a tilt angle of about 7° is used to form an implant dose of about $3 \times 10^{12}$ atm/cm² in the substrate in the channel area of the NMOS sense transistor.

Following the n-channel implant 606, the n-channel mask is removed and a p-channel mask and implant steps occur. As shown at FIGS. 6 and 7C, first, a p-channel device mask is formed 608 and prevents implantation to all but the substrate area where the PMOS sense transistor is formed. Next, a p-channel implant of phosphorous at an energy of about 55 KeV and an angle of about 7° to form an implant region of about $8.0 \times 10^{12}$ atm/cm$^2$ is performed in the channel area of the PMOS sense transistor.

Next, as shown in FIG. 6 and FIGS. 7D–7F, processing of the device including the p-channel implant step group 410, device processing 430, and oxidation 432 occur as in the prior art method shown in FIG. 4.

At step 636, the n-channel device mask layer normally used for the n-channel device adjustment implants is reconfigured to prevent channel adjustment of the NMOSFET sense transistor 104 as illustrated in FIG. 7G. The implants at group 420 are thereafter performed as to other NMOS devices (such as device 110), but do not affect device 104. Processing of the device is thereafter completed as in the prior art process.

The following table shows the resulting change in the voltage across the oxide of the sense transistor when the voltage is reduced by delta V$_t$ of 0.5 volts:

TABLE 2

|  | Normal | V$_t$ reduced 0.5 V |
|---|---|---|
| V$_{ox}$ cross Sense Transistor | 2.20 | 1.77 |

A similar delta Vt is seen at the PMOSFET. As a result, in certain key aspects of the cell, lower voltages and improved data retention will result. For example, following programming the typical threshold voltage of the NMOSFET 104 and PMOSFET 102 will have decreased by about 0.43 volts on average, and may range from a delta Vt of 0.63 volts (at minimum voltages) to 0.53 volts at higher program voltages.

The foregoing detailed description of the invention has been presented for purposes of illustration and description. It is not intended to be exhaustive or to limit the invention to the precise form disclosed. Many modifications and variations are possible in light of the above teaching. For example, the invention has been described with respect to particular technologies such as NMOS and PMOST used for certain transistors in the cell. It should be recognized that complementary transistors may also be used.

In addition, it should be recognized that the principle of the invention of reducing transistor threshold voltage may be applied to alternative embodiments of cells, including two-transistor cells. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory cell, comprising:
   a first NMOS transistor having a source, drain and gate; and
   a first PMOS transistor having a source, drain and gate, the gate of the PMOS transistor being coupled to a floating gate region and the gate of the first NMOS transistor, and the drain of the PMOS transistor coupled to the drain of the first NMOS transistor,
   wherein at least one of the first NMOS transistor and first PMOS transistor includes a three-implant channel region to reduce the threshold voltage of the transistor.

2. A memory cell, comprising:
   a first NMOS transistor having a source, drain and gate; and
   a first PMOS transistor having a source, drain and gate, the gate of the PMOS transistor being coupled to a floating gate region and the gate of the first NMOS transistor, and the drain of the PMOS transistor coupled to the drain of the first NMOS transistor,
   wherein the first NMOS transistor and first PMOS transistor each include a three-implant channel region to reduce the threshold voltage of the transistors.

3. A memory cell, comprising:
   a first NMOS transistor having a source, drain and gate;
   a first PMOS transistor having a source, drain and gate, the gate of the PMOS transistor being coupled to a floating gate region and the gate of the first NMOS transistor, and the drain of the PMOS transistor coupled to the drain of the first NMOS transistor; and
   a second NMOS transistor, having a drain coupled to a tunnel capacitor, the output of the tunnel capacitor coupled to the floating gate region,
   wherein the first NMOS transistor and first PMOS transistor each include a three-implant channel region to reduce the threshold voltage of the transistors.

4. The cell of claim 3 wherein the second NMOS transistor includes a two-implant channel region.

5. The cell of claim 4 wherein the first NMOS transistor and PMOS transistor are formed with a first, second and third successive implants in their channel regions, and the second NMOS transistor does not include the first implant in its channel region.

6. The cell of claim 3 wherein the first implant for the first NMOS transistor comprises boron having a concentration of $3 \times 10^{12}$ atm/cm$^2$.

7. The cell of claim 3 wherein the first implant for the first PMOS transistor comprises phosphorous having a concentration of about $8 \times 10^{12}$ atm/cm$^2$.

8. The cell of claim 3 wherein the first PMOS transistor three-implant region further includes:
   a region of phosphorous at an at a concentration of $4 \times 10^{12}$ atm/cm$^2$;
   a region of arsenic at a concentration of $4 \times 10^{12}$ atm/cm$^2$; and
   a region of phosphorous at having an impurity concentration of $3.2 \times 10^{12}$ atm/cm$^2$.

9. The cell of claim 3 wherein the first NMOS transistor three-implant region includes:
   a first region of boron having an impurity concentration of $4.4 \times 10^{12}$ atm/cm$^2$;
   a second region of boron having an impurity concentration of $4 \times 10^{12}$ atm/cm$^2$; and
   a third region of BF$_2$ having an impurity concentration of $3.2 \times 10^{12}$ atm/cm$^2$.

* * * * *